(12) United States Patent
Zuercher

(10) Patent No.: US 8,198,870 B2
(45) Date of Patent: Jun. 12, 2012

(54) SYSTEM AND METHOD FOR PERFORMING ULTRACAPACITOR CELL BALANCING

(75) Inventor: Joseph Charles Zuercher, Brookfield, WI (US)

(73) Assignee: Eaton Corporation, Cleveland, OH (US)

( * ) Notice: Subject to any disclaimer, the term of this patent is extended or adjusted under 35 U.S.C. 154(b) by 409 days.

(21) Appl. No.: 12/493,287

(22) Filed: Jun. 29, 2009

(65) Prior Publication Data

US 2009/0322289 A1 Dec. 31, 2009

Related U.S. Application Data

(60) Provisional application No. 61/133,539, filed on Jun. 30, 2008.

(51) Int. Cl.
| | |
|---|---|
| H02J 7/00 | (2006.01) |
| H02H 7/04 | (2006.01) |
| H01G 4/005 | (2006.01) |
| G01R 19/00 | (2006.01) |
| G01R 15/00 | (2006.01) |

(52) U.S. Cl. ........ 320/167; 361/41; 361/303; 361/306.3; 361/502; 327/309; 327/530; 324/76.11; 324/426; 702/57

(58) Field of Classification Search .................. 320/167
See application file for complete search history.

(56) References Cited

U.S. PATENT DOCUMENTS

| | | | |
|---|---|---|---|
| 7,345,454 B2 * | 3/2008 | Thrap | 320/135 |
| 2004/0150926 A1 * | 8/2004 | Wilk et al. | 361/42 |
| 2005/0041370 A1 * | 2/2005 | Wilk et al. | 361/502 |
| 2005/0180074 A1 | 8/2005 | Doljack et al. | |
| 2006/0087287 A1 * | 4/2006 | Thrap | 320/118 |
| 2007/0001651 A1 * | 1/2007 | Harvey | 320/166 |
| 2008/0106239 A1 * | 5/2008 | Cegnar | 320/167 |

FOREIGN PATENT DOCUMENTS

DE 102005041824 A1 3/2007

* cited by examiner

*Primary Examiner* — Yalkew Fantu
(74) *Attorney, Agent, or Firm* — Ziolkowski Patent Solutions Group, SC

(57) ABSTRACT

A circuit for balancing a sub-stack voltage in a stack of ultracapacitors includes a pair of electrical leads that are connectable across a first sub-stack of one or more ultracapacitors, wherein a stack includes N sub-stacks of ultracapacitors coupled to an electrical bus, a discharge device switchably connectable with the pair of electrical leads, the discharge device configured to discharge the sub-stack of ultracapacitors, a voltage sensing circuit coupled to the electrical bus and configured to sense and output a voltage of the stack of ultracapacitors after the first sub-stack of one or more ultracapacitors has been discharged to a given threshold, and a voltage amplifier coupled to the output of the voltage sensing circuit and coupled to the pair of electrical leads, the voltage amplifier configured to provide a re-charge voltage to the first sub-stack of one or more ultracapacitors.

20 Claims, 3 Drawing Sheets

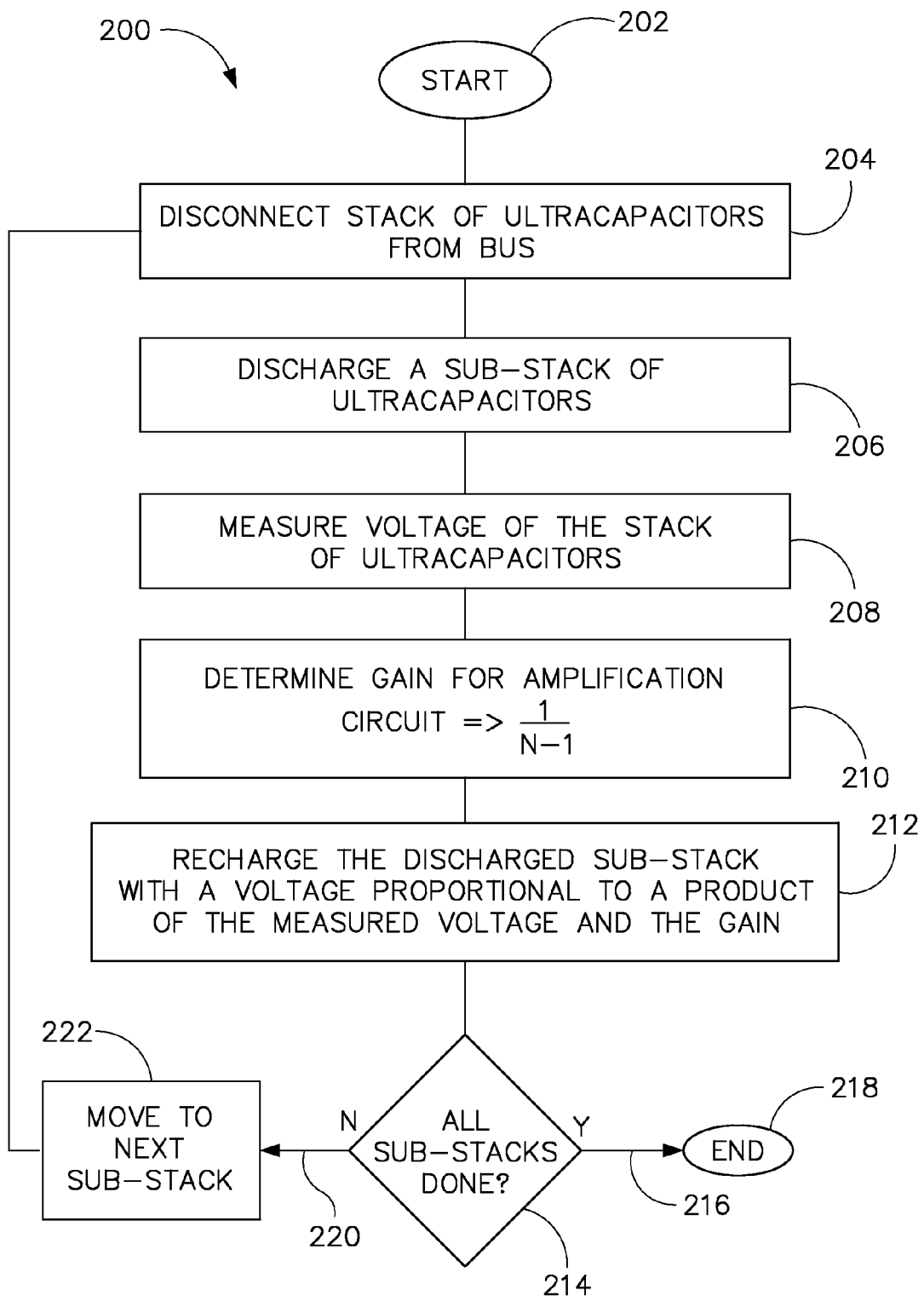

SYSTEM AND METHOD FOR PERFORMING ULTRACAPACITOR CELL BALANCING

CROSS-REFERENCE TO RELATED APPLICATION

The present application is a non-provisional of, and claims priority to, U.S. Provisional Application 61/133,539 filed Jun. 30, 2008, which is incorporated herein by reference.

BACKGROUND OF THE INVENTION

The invention relates generally to ultracapacitors and, more particularly, to a system and method for performing ultracapacitor cell balancing.

Ultracapacitors, also known as supercapacitors, are electrochemical capacitors that have a high energy density as compared to common capacitors. Typically a capacitance of an ultracapacitor is on the order of thousands of times greater than a conventional electrolytic capacitor. In contrast to conventional capacitors, ultracapacitors typically use plates that are two layers of the same substrate that form an electrical double layer. The plates are typically separated by a nanoporous material such as activated charcoal that allows the separation to be in the nanometer range. Because of the very high surface area of the nanoporous material, many charge carriers can be stored in a given volume. The overall surface area of the nanoporous material is vastly greater than the plates of a conventional capacitor, hence the very large increase in capacitance compared to conventional capacitors.

The nanoporous material is susceptible to voltage breakdown and is thus limited, typically, to operating voltages in the range of 2-3 volts. Nominally, ultracapacitors may operate typically at 2.5 volts and during extremes may be taken to, for instance, 3.6 volts. However, such extremes are detrimental to the life of the ultracapacitor and failure may occur, which may result in an open cell. Further, the expected lifetime of an ultracapacitor is temperature dependent as well. Thus, for a given nominal operating condition of, for instance, 2.5 volts at a temperature of 25° C., the corresponding nominal life of the ultracapacitor is reduced at increased operating temperatures and/or operating voltages.

Large ultracapacitors, thus, may include designs having thousands of farads that are capable of 5-10 watt-hr/kg (Wh/kg) storage energy or more and on the order of thousands of watt/kg (W/kg) power density. As such, they are capable of providing high energy storage with quick discharge that makes them ideal for applications where quick power bursts and high energy storage are desired. Such applications may include but are not limited to regenerative braking systems, vehicle starting in cold conditions, crane lifting, and plug-in hybrid electric vehicles. Ultracapacitors are rechargeable many times over if operated within nominal conditions, they exhibit low self-discharge, and provide excellent stability over a range of temperatures.

Most such applications, however, use working voltages that are greater than the nominal 2.5 volts typically provided by an ultracapacitor. Thus, to obtain working voltages, ultracapacitors are typically connected in stacks or series of cells. However, due to temperature gradients and manufacturing irregularities, imbalance can occur between the cells which can lead to poor system operation or failure due to overvoltage of one or more of the ultracapacitors within the stack. Typically, under nominal operating conditions, an ultracapacitor can have 10 years and 1 million cycles or more. However, such life is negatively affected by operating at overvoltage, and actual life can be based on a prorated or percentage time spent operating at the elevated voltage or temperature. If voltage balancing is not provided, voltages become imbalanced, thus the entire stack is typically operated at a lower voltage in order to keep the worst case or "maverick" cell at or below nominal voltage. Further, fully failed cells cause an open of the cell, thus preventing all others within a string or sub-stack from delivering power, which drops energy storage as the square of the voltage, reducing storage and performance.

To avoid this, active cell balancing circuits and passive parallel resistance circuits have been used to prevent exceeding the maximum cell voltage in a given cell. Though these solutions may offer improvements for some systems, they introduce tradeoffs as well. For instance, passive resistance circuits may tend to increase self-discharge for many applications and may be used to periodically discharge or dump energy therefrom on an occasional basis. Active and individual cell balancing may be effective, but adds cost—both in complexity to the system design and complexity of operation.

Therefore, an apparatus and method of performing ultracapacitor cell balancing within a stack that overcomes the aforementioned drawbacks would be desirable.

BRIEF DESCRIPTION OF THE INVENTION

The present invention provides a system and method for balancing a sub-set of ultracapacitors within a stack of ultracapacitors that overcomes the aforementioned drawbacks.

In accordance with one aspect of the invention, a circuit for balancing a sub-stack voltage in a stack of ultracapacitors includes a pair of electrical leads that are connectable across a first sub-stack of one or more ultracapacitors, wherein a stack includes N sub-stacks of ultracapacitors coupled to an electrical bus, a discharge device switchably connectable with the pair of electrical leads, the discharge device configured to discharge the sub-stack of ultracapacitors, a voltage sensing circuit coupled to the electrical bus and configured to sense and output a voltage of the stack of ultracapacitors after the first sub-stack of one or more ultracapacitors has been discharged to a given threshold, and a voltage amplifier coupled to the output of the voltage sensing circuit and coupled to the pair of electrical leads, the voltage amplifier configured to provide a re-charge voltage to the first sub-stack of one or more ultracapacitors.

In accordance with another aspect of the invention, a method includes A) discharging a sub-set of ultracapacitor cells, B) measuring a voltage across a stack of N ultracapacitor cells after the sub-set of ultracapacitor cells has been discharged, the stack of N ultracapacitor cells comprising the sub-set of ultracapacitor cells, and C) re-charging the discharged sub-set of ultracapacitor cells with a voltage amplifier configured to output a voltage proportional to the measured voltage across the stack of N ultracapacitor cells and proportional to a gain of $1/(N-1)$.

In accordance with yet another aspect of the invention, a method includes discharging a sub-set of ultracapacitors of a bank of N ultracapacitors, sensing a voltage across the bank of N ultracapacitors after the sub-set of ultracapacitors has been discharged, determining a gain for a voltage amplifier, and re-charging the sub-set of ultracapacitors with a voltage approximately equal to the product of the sensed voltage and the gain.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings:

FIG. 3 illustrates a method of balancing a sub-stack of ultracapacitors within a stack of ultracapacitors according to an embodiment of the invention.

DETAILED DESCRIPTION OF THE INVENTION

The embodiments of the invention set forth herein relate to a system and method of balancing a voltage across a sub-set of ultracapacitors within a series of ultracapacitors.

Figure 1:
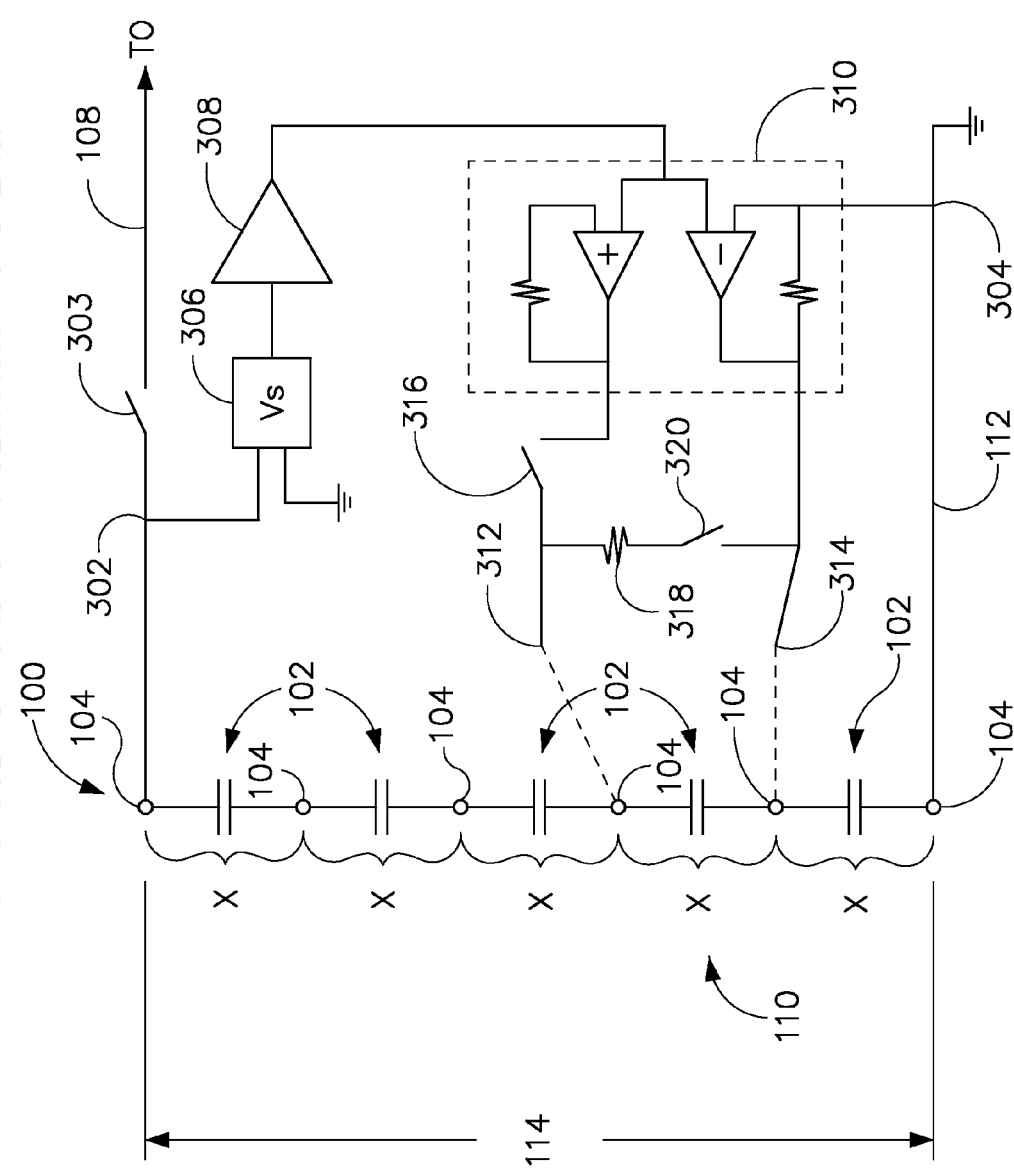
FIG. 1 illustrates a circuit for balancing a sub-stack of ultracapacitors within a stack of ultracapacitors according to an embodiment of the invention.

FIG. 1 illustrates a circuit 300 for balancing ultracapacitors according to an embodiment of the invention. Circuit 300 is coupled to a stack of ultracapacitors 100 that is divided into sub-stacks 102 of ultracapacitor cells. Each sub-stack 102 of ultracapacitors is separated by a pair of electrical nodes 104. FIG. 1 illustrates N sub-stacks 102 of X ultracapacitor cells in each sub-stack 102. Thus, in the example illustrated, there are N=5 sub-stacks 102 of X ultracapacitors.

Figure 2:
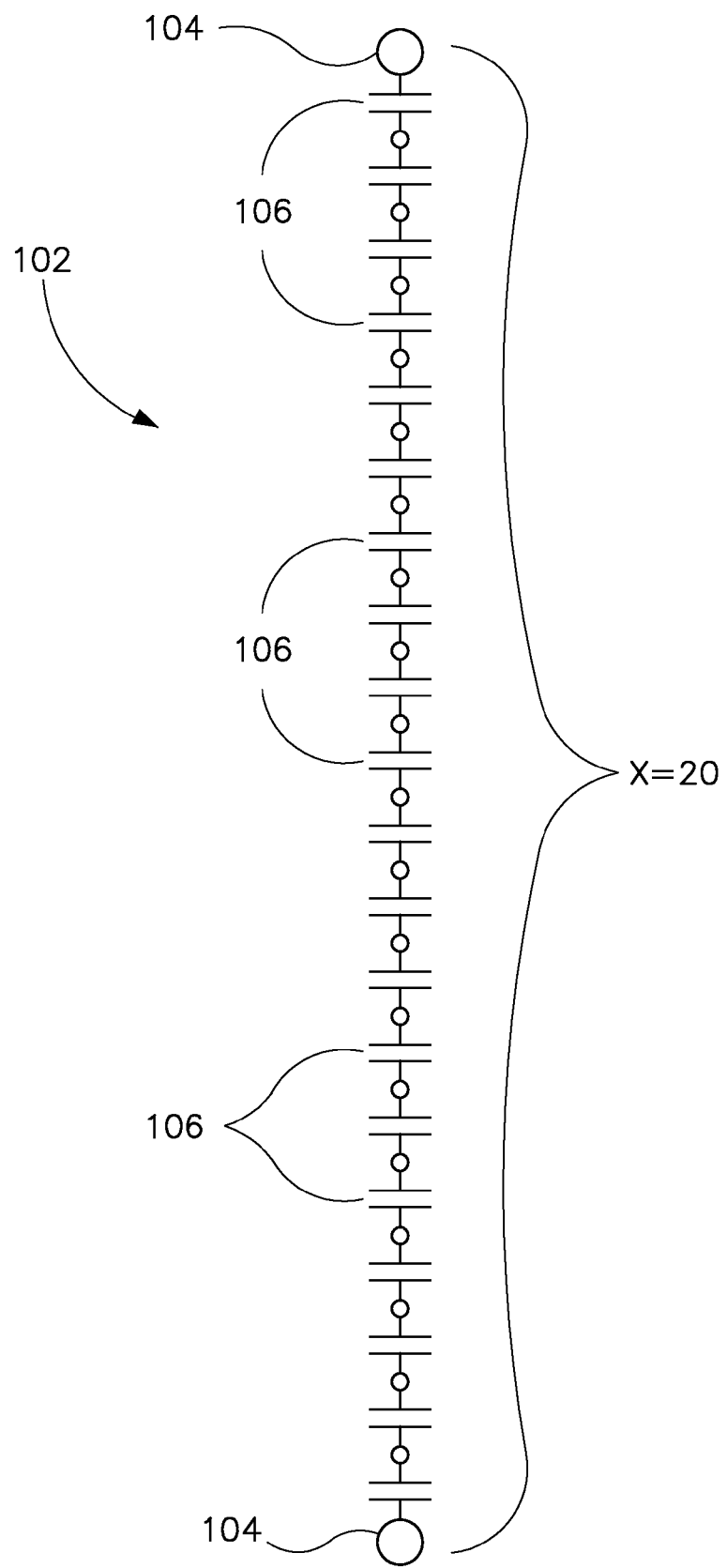
FIG. 2 illustrates a sub-stack of ultracapacitors of FIG. 1

Referring now to FIG. 2, a single sub-stack 102 of X=20 ultracapacitor cells 106 is illustrated as an example according to an embodiment of the invention. Further, in this example, each ultracapacitor cell 106 has a capacity to hold a voltage of 2.5 V. Accordingly, for a sub-stack 102 of twenty charged ultracapacitor cells 106, the voltage between the pair of nodes 104 is thus 20×2.5 V, or 50 V.

Referring to FIGS. 1 and 2, since ultracapacitor stack 100 contains N=5 sub-stacks 102 of X=20 ultracapacitors in each sub-stack 102 as an example, there are thus a total of 5×20, or 100 ultracapacitors in stack 100. Because each sub-stack 102 provides a nominal 50 V supply, the total voltage, $V_{stack}$, supplied to a bus via a bus-line 108 is thus 5×50 V or 250 V.

Circuit 300 includes a first node 302 connectable to voltage bus-line 108 and a second node 304 connectable to ground. Circuit 300 is disconnectable from the voltage bus via a switch 303 in voltage bus-line 108. As such, circuit 300 is thus connected across stack of ultracapacitors 100 and may be connected or disconnected from the bus, via bus-line 108, that is supplied by stack of ultracapacitors 100.

Circuit 300 includes a voltage sensing element 306 and an amplifier 308 coupled to an output of voltage sensing element 306. In one embodiment, amplifier 308 is an operational amplifier (opamp). In one embodiment, amplifier 308 is configured to have a gain of 1/(N−1), or 1/(5−1)=0.25 for N=5 sub-stacks 102 of ultracapacitors as discussed in the example above.

Circuit 300 includes a differential unit gain opamp buffer 310 coupled to an output of amplifier 308 and coupled to both a first discharge/re-charge lead 312 and a second discharge/re-charge lead 314 via a switch 316. Circuit 300 includes a discharge device 318, which, in the embodiment illustrated, is an electrical resistor connectable to leads 312, 314 via a switch 320. According to other embodiments of the invention, discharge device 318 is a rechargeable energy storage device such as a battery or an ultracapacitor that may be configured to store some or all of the energy for later use during a re-charge process.

According to one embodiment of the invention, in operation, after disconnecting bus-line 108 from circuit 300 via switch 303, first and second discharge/re-charge leads 312, 314 are connected across a sub-stack 110 of ultracapacitors. With switch 316 in an open position, switch 320 is closed, thus allowing sub-stack 110 to discharge through discharge device 318. After discharging sub-stack 110 to zero volts, switch 320 is opened, and voltage sensing element 306 measures a voltage 114 across the stack of ultracapacitors 100 from bus-line 108 to a ground 112. Once the voltage 114 across the stack of ultracapacitors 100 is measured, it is modified with a gain of 1/(N−1) using amplifier 308. Switch 316 is closed and the voltage generated from amplifier 308 is passed through differential unit gain opamp buffer 310 to leads 312, 314.

Thus, after discharge of sub-stack 110 and as discussed in the example above, the stack of ultracapacitors 100 has a nominal voltage of 200 V remaining, which is in turn modified by a gain of 0.25 to 50 V, thus providing a re-charge voltage based on the sensed voltage and on a gain that is based on the number of sub-stacks 102 of ultracapacitors. Once sub-stack 110 is re-charged, the remaining sub-stacks 102 may be discharged and re-charged one at a time in a similar fashion according to embodiments of the invention. In embodiments of the invention where discharge device 318 is an energy storage device such as a battery or an ultracapacitor, the energy stored therein may be selectively discharged therefrom and input back into sub-stack 110 with selective control of switches 316 and 320 as is understood in the art.

One skilled in the art will recognize that, although a specific example of a bank of one hundred ultracapacitors and five sub-stacks of ultracapacitors is illustrated and discussed above, the embodiments presented herein are generally applicable and may be used to balance a bank of ultracapacitors having any number of ultracapacitors and any number of respective banks of sub-stacks of ultracapacitors. The number within each sub-stack selected for discharge and re-charge may be based on a number of factors. For instance, in the example above having a bank of one hundred ultracapacitors and five sub-stacks of ultracapacitors, because each sub-stack comprises ⅕ of the total bank of one hundred ultracapacitors, when each sub-stack is discharged, it draws the entire stack voltage down by 20%. Thus, when implementing a discharge/re-charge process, such a large draw-down of voltage may mean that the bus needs to be disconnected from the stack, as was described with respect to switch 303. Further, because each sub-stack includes twenty ultracapacitors as in the above example, the amount of time for discharge and re-charge may be relatively long and may cause the bus to be disconnected for extended periods of time. Such effects may be reduced by decreasing the number of ultracapacitors in each sub-stack 102 at the expense of additional connections and disconnections to the stack of ultracapacitors 100.

For instance, in the example above having one hundred ultracapacitors in the stack 100, each sub-stack 102 may be selected having two, five, ten, etc. or any number of ultracapacitors per sub-stack 102, so long as the gain for amplifier 308 is calculated accordingly. As examples, referring to Table 1 below, Vcell is provided along with a total number of ultracapacitors in the first two columns. $V_{stack}$ represents a total voltage of the stack 100 that is the product of Vcell and Total U-caps. N represents the total number of sub-stacks 102, and X represents the number of ultracapacitors 106 per sub-stack 102. Accordingly, after one of the sub-stacks such as sub-stack 110 has been discharged in the manner described above, then $V_{sense}$ represents the voltage of the remaining/charged ultracapacitors 106 that will nominally be measured by voltage sensing element 306 (though $V_{sense}$ is measured across an entire stack 100). The corresponding gain as calculated by 1/(N−1) is illustrated in Table 1, and the resultant re-charge voltage is illustrated as well.

TABLE 1

| Vcell | Total U-caps | $V_{stack}$ | N | X (#/sub-stack) | $V_{sense}$ | Gain | $V_{re-charge}$ |
|---|---|---|---|---|---|---|---|
| 2.5 | 40 | 100 | 4 | 10 | 75 | 1/3 | 25 |
| 2.5 | 100 | 250 | 5 | 20 | 200 | 1/4 | 50 |
| 2.5 | 100 | 250 | 4 | 25 | 187.5 | 1/3 | 62.5 |

At one extreme, each sub-stack 102 of ultracapacitors includes only one cell or ultracapacitor 106. Thus, in an example having a stack 100 of one hundred ultracapacitors and one ultracapacitor per sub-stack 102, when discharge of a sub-stack 102 occurs, then only 1/100 or 1% of stack voltage is drawn down. In this example, it is possible to conduct the discharge/re-charge process of each sub-stack 102 of one ultracapacitor while leaving the stack 100 connected to the bus via switch 303. In other words, if the voltage of the sub-stack 102 is sufficiently small to allow system operation to continue and the remaining voltage is sufficient, then in this case it is possible to conduct the discharge/re-charge process of a sub-stack 102 of ultracapacitors without de-coupling the stack 100 from the bus via switch 303. Such a system, however, is enabled if access is individually provided to each ultracapacitor 106 in the stack 100.

Conversely, it may be desirable in all configurations to disconnect the stack 100 from the bus via switch 303. However, it is possible that an emergency situation may arise that may necessitate re-connection of stack 100 to the bus during the balancing or recharge process. Thus, it may be desirable to increase the number of sub-stacks 102 and correspondingly decrease the voltage in each to minimize the effects of reduced power and voltage in the event that the emergency reconnection occurs after discharge but before re-charge of the sub-stack 102 being balanced.

Each sub-stack 102 of ultracapacitors may be separately electrically balanced according to embodiments of the invention and as illustrated in FIG. 3. Referring to process 200 of FIG. 3 and correspondingly to components illustrated in FIGS. 1 and 2, process 200 starts at step 204 in which the stack 100 of ultracapacitors is disconnected from the bus via switch 303. At step 206, one of the sub-stacks 102, illustrated as element 110 as an example, is discharged to zero volts. After sub-stack 110 is discharged, voltage $V_{sense}$ of the entire stack of ultracapacitors 100, from ground 112 to bus-line 108, is measured at step 208. In the example provided above of five sub-stacks 102 having nominally 50 V each, a nominally charged stack of all five sub-stacks is approximately 250 V, thus the sensed voltage $V_{sense}$ after discharge of sub-stack 110 is nominally 200 V between bus-line 108 and ground 112.

The gain for re-charge of sub-stack 110 is calculated at step 210 as 1/(N−1). Thus, in the example above of N=5 sub-stacks 102 of ultracapacitors, the gain calculated at step 210 is 1/(5−1)=0.25. Sub-stack 110 is then re-charged at step 212 with a voltage that is proportional to both the sensed voltage $V_{sense}$ and proportional to the gain, and in one embodiment, the re-charge voltage is the product of $V_{sense}$ and the gain. Thus, in this example, a re-charge voltage of 200×0.25, or 50 V, is obtained by simply measuring the voltage across the stack 100 after one sub-stack 110 is discharged, and by using a gain based on the number N of sub-stacks 102 of ultracapacitors within stack 100.

At step 214, process 200 determines whether all sub-stacks 102 are completed and have been balanced. If so 216, the process ends at step 218. If all sub-stacks have not been balanced 220, then the process directs process control to move to the next sub-stack 102 at step 222, and process control returns to step 204 for the process described above to be applied to the next sub-stack 102.

Thus, method 200 of FIG. 3 and circuit 300 of FIG. 1 illustrate a general method and circuit for performing a discharge/re-charge operation for a sub-stack 102 of ultracapacitors, and Table 1 illustrates but a few examples of such overall configuration options. Embodiments of the invention are in no way limited to such examples but may be used for any combination of ultracapacitors having sub-stacks of ultracapacitors. By appropriately selecting the number of ultracapacitors in a sub-stack, embodiments of the invention may be implemented in a system while the stack remains on-line for a sufficiently small sub-stack voltage, or embodiments of the invention may be implemented by taking the stack off-line and enabling a quick reconnection to the stack during an emergency.

Therefore, according to one embodiment of the invention, a circuit for balancing a sub-stack voltage in a stack of ultracapacitors includes a pair of electrical leads that are connectable across a first sub-stack of one or more ultracapacitors, wherein a stack includes N sub-stacks of ultracapacitors coupled to an electrical bus, a discharge device switchably connectable with the pair of electrical leads, the discharge device configured to discharge the sub-stack of ultracapacitors, a voltage sensing circuit coupled to the electrical bus and configured to sense and output a voltage of the stack of ultracapacitors after the first sub-stack of one or more ultracapacitors has been discharged to a given threshold, and a voltage amplifier coupled to the output of the voltage sensing circuit and coupled to the pair of electrical leads, the voltage amplifier configured to provide a re-charge voltage to the first sub-stack of one or more ultracapacitors.

According to another embodiment of the present invention, a method includes A) discharging a sub-set of ultracapacitor cells, B) measuring a voltage across a stack of N ultracapacitor cells after the sub-set of ultracapacitor cells has been discharged, the stack of N ultracapacitor cells comprising the sub-set of ultracapacitor cells, and C) re-charging the discharged sub-set of ultracapacitor cells with a voltage amplifier configured to output a voltage proportional to the measured voltage across the stack of N ultracapacitor cells and proportional to a gain of 1/(N−1).

In accordance with yet another embodiment of the invention, a method includes discharging a sub-set of ultracapacitors of a bank of N ultracapacitors, sensing a voltage across the bank of N ultracapacitors after the sub-set of ultracapacitors has been discharged, determining a gain for a voltage amplifier, and re-charging the sub-set of ultracapacitors with a voltage approximately equal to the product of the sensed voltage and the gain.

The present invention has been described in terms of the preferred embodiment, and it is recognized that equivalents, alternatives, and modifications, aside from those expressly stated, are possible and within the scope of the appending claims.

What is claimed is:

1. A circuit for balancing a sub-stack voltage in a stack of ultracapacitors, the circuit comprising:
   a pair of electrical leads that are connectable across different sub-stacks of one or more ultracapacitors, wherein a stack includes N sub-stacks of ultracapacitors coupled to an electrical bus;
   a discharge device switchably connectable with the pair of electrical leads, the discharge device configured to discharge each sub-stack of ultracapacitors;
   a voltage sensing circuit coupled to the electrical bus and configured to sense and output a voltage of the stack of ultracapacitors after the first sub-stack of one or more ultracapacitors has been discharged to a given threshold; and a voltage amplifier coupled to the output of the voltage sensing circuit and coupled to the pair of electrical leads, the voltage amplifier configured to provide a re-charge voltage to the first sub-stack of one or more ultracapacitors.

2. The circuit of claim 1 wherein the voltage amplifier is configured to have a gain of $1/(N-1)$.

3. The circuit of claim 1 wherein the voltage amplifier is an operational amplifier connected to the voltage sensing circuit and the pair of electrical leads, and wherein the discharge device is a resistor switchably connectable in series with the pair of electrical leads.

4. The circuit of claim 1 comprising a differential unity gain operational amplifier buffer coupled to an output of the voltage amplifier and configured to pass the voltage from the voltage amplifier to the first sub-stack of one or more ultracapacitors.

5. The circuit of claim 1 wherein the device is an energy storage device configured to store energy and configured to use the stored energy to re-charge the first sub-stack of one or more ultracapacitors.

6. The circuit of claim 5 wherein the device is one of a battery and an ultracapacitor.

7. A method comprising:
A) discharging a sub-set of ultracapacitor cells;
B) measuring a voltage across a stack of N ultracapacitor cells after the sub-set of ultracapacitor cells has been discharged, the stack of N ultracapacitor cells comprising the sub-set of ultracapacitor cells; and
C) re-charging the discharged sub-set of ultracapacitor cells with a voltage amplifier configured to output a voltage proportional to the measured voltage across the stack of N ultracapacitor cells and proportional to a gain of $1/(N-1)$.

8. The method of claim 7 wherein the sub-set of ultracapacitors includes only one ultracapacitor cell.

9. The method of claim 7 wherein re-charging the discharged sub-set of ultracapacitor cells comprises outputting an energy via the voltage amplifier that is a product of both the measured voltage across the stack of N ultracapacitor cells and the gain of $1/(N-1)$.

10. The method of claim 7 further comprising repeating steps A-C for each sub-set of ultracapacitor cells of the stack of N ultracapacitor cells.

11. The method of claim 7 wherein discharging the sub-set of ultracapacitor cells comprises discharging an energy of the sub-set of ultracapacitor cells through an electrically resistive device.

12. The method of claim 7 wherein discharging energy from the sub-set of ultracapacitor cells comprises storing an energy of the sub-set of ultracapacitor cells into an energy storage unit.

13. The method of claim 12 wherein re-charging the discharged sub-set of ultracapacitor cells comprises re-charging the discharged sub-set of ultracapacitor cells using the energy stored in the energy storage unit.

14. A method comprising:
discharging a sub-set of ultracapacitors of a bank of N ultracapacitors;
sensing a voltage across the bank of N ultracapacitors after the sub-set of ultracapacitors has been discharged;
determining a gain for a voltage amplifier; and
re-charging the sub-set of ultracapacitors with a voltage approximately equal to the product of the sensed voltage and the gain.

15. The method of claim 14 wherein the gain is $1/(N-1)$.

16. The method of claim 14 wherein discharging the sub-set of ultracapacitors comprises discharging an energy of the sub-set of ultracapacitors via an electrically resistive device.

17. The method of claim 14 wherein discharging the sub-set of ultracapacitors comprises discharging an energy the sub-set of ultracapacitors into an energy storage device.

18. The method of claim 17 wherein the energy storage device is one of a battery and an ultracapacitor.

19. The method of claim 17 wherein re-charging the sub-set of ultracapacitors comprises re-charging the sub-set of ultracapacitors using the energy stored in the energy storage device.

20. The method of claim 14 wherein the voltage amplifier is an operational amplifier.

* * * * *